(12) United States Patent
Ayers et al.

(10) Patent No.: US 8,847,136 B2
(45) Date of Patent: Sep. 30, 2014

(54) CONVERSION GAIN MODULATION USING CHARGE SHARING PIXEL

(75) Inventors: Thomas Ayers, Morgan Hill, CA (US); Frederick Thomas Brady, Webster, NY (US); Jinsuk Kang, Palo Alto, CA (US); Sungin Hwang, Pittsford, NY (US); Sen Yu, San Jose, CA (US)

(73) Assignee: PIXIM, Inc., Mountain View, CA (US)

( * ) Notice: Subject to any disclaimer, the term of this patent is extended or adjusted under 35 U.S.C. 154(b) by 246 days.

(21) Appl. No.: 13/333,133

(22) Filed: Dec. 21, 2011

(65) Prior Publication Data

US 2013/0020466 A1    Jan. 24, 2013

Related U.S. Application Data

(60) Provisional application No. 61/429,162, filed on Jan. 2, 2011.

(51) Int. Cl.
*H04N 5/355* (2011.01)
*H01L 27/146* (2006.01)

(52) U.S. Cl.
CPC .... *H01L 27/14609* (2013.01); *H01L 27/14683* (2013.01); *H04N 5/355* (2013.01); *H04N 5/3559* (2013.01)
USPC .................................... 250/208.1; 250/214.1

(58) Field of Classification Search
USPC ............................. 250/208.1, 214.1; 348/308
See application file for complete search history.

(56) References Cited

U.S. PATENT DOCUMENTS

| | | | |
|---|---|---|---|
| 7,196,304 B2 * | 3/2007 | Altice et al. | 250/208.1 |
| 7,485,836 B2 * | 2/2009 | Altice et al. | 250/208.1 |
| 7,557,335 B2 | 7/2009 | Hong et al. | |
| 7,781,718 B2 | 8/2010 | Rhodes | |
| 7,829,832 B2 | 11/2010 | Mauritzson et al. | |
| 8,138,462 B2 * | 3/2012 | Altice et al. | 250/208.1 |
| 2004/0251394 A1 | 12/2004 | Rhodes et al. | |
| 2004/0256561 A1 | 12/2004 | Beuhler et al. | |
| 2007/0252182 A1 | 11/2007 | Beck | |
| 2009/0001427 A1 | 1/2009 | Adkisson et al. | |
| 2009/0042331 A1 | 2/2009 | Dosluoglu et al. | |
| 2009/0272879 A1 | 11/2009 | Dai | |
| 2010/0066653 A1 | 3/2010 | Yamazaki et al. | |
| 2010/0276574 A1 | 11/2010 | Manabe | |

FOREIGN PATENT DOCUMENTS

WO    WO03054922    *   7/2003

OTHER PUBLICATIONS

International Search Report and Written Opinion, 13 pages.

* cited by examiner

*Primary Examiner* — Tony Ko
(74) *Attorney, Agent, or Firm* — Rader, Fishman & Grauer PLLC

(57) ABSTRACT

An image sensor including an array of pixel elements is operated according to two operation modes to modulate the conversion gain of the pixel to operate the image sensor based on the impinging light conditions. More specifically, an image sensor pixel element is operated in a high conversion gain mode for low light conditions and in a low conversion gain mode for bright light conditions. The low conversion gain mode implements charge sharing between the floating diffusion and the photodiode. The low conversion gain mode further implements partial reset where the photodiode and the floating diffusion are reset to the same potential and to a potential slightly less than the pinning voltage of the photodiode.

20 Claims, 8 Drawing Sheets

CONVERSION GAIN MODULATION USING CHARGE SHARING PIXEL

CROSS-REFERENCE TO RELATED APPLICATIONS

This application claims the benefit of U.S. Provisional Patent Application Ser. No. 61/429,162, filed on Jan. 2, 2011, which application is incorporated herein by reference in its entirety.

FIELD OF THE INVENTION

The invention relates to image sensors and, in particular, to image sensors with multiple conversion gain settings.

DESCRIPTION OF THE RELATED ART

CMOS image sensor pixel circuits formed using four transistors are known and are referred to as 4T image sensor pixels or "4T pixels." In 4T CMOS image sensor pixels, the photodiode (PD) provides the photon to electron conversion, while the floating diffusion (FD) provides the electron to voltage conversion. The voltage per electron conversion of the FD is known as conversion gain (CG) and is an important parameter for CMOS image sensors. Conversion gain boosts the pixel signal relative to the analog noise, thereby reducing the noise floor, and thereby enabling performance at lower light levels. For large size pixels, low light sensitivity can be limited by the CG of the FD. In particular, in low light conditions, high gain is required and thus, low FD node capacitance is desired. However, in bright light conditions, high FD capacitance is desired to collect all of the charge from the photodiode. High FD capacitance makes the pixel gain low.

FIG. 1 is a schematic diagram of a conventional 4T CMOS image sensor pixel. Typically, pixel 10 will have a large FD capacitance to enable collection of all charge collected by the photodiode in high light or bright light conditions, enabling high shot noise limited SNR. Therefore, the pixel will suffer from low CG in low light conditions, leading to reduced sensitivity, particularly in low light conditions.

In some cases, a pixel circuit is configured with a FD capacitance that can be switched from a high value in high light conditions to a low value in low light conditions. One known method of accomplishing this is using dual gain pixels, in which the FD is designed with small baseline capacitance, but attached to an additional capacitor element by a transistor, as shown in FIG. 2, to introduce additional capacitance to the FD node when needed. In low light conditions, the gate control signal DCG is off and transistor M5 is disabled. Therefore, the FD node provides only the low baseline capacitance. However, in high light conditions, the gate control signal DCG is turned on and transistor M5 is enabled, connecting the additional capacitor element C5 to the FD node 14, thereby increasing the baseline FD capacitance. However, this method requires two additional elements (transistor M5 and capacitor C5) added to the pixel circuit and so reduces the pixel fill factor (reducing sensitivity and photodiode full well). Additionally, the gate electrode of the additional transistor M5 increases the floating diffusion capacitance even when the transistor is turned off, due to the extra metal wiring and gate capacitances. The additional capacitance from the additional transistor M5 reduces the pixel's low light sensitivity.

SUMMARY OF THE INVENTION

According to one embodiment of the present invention, an image sensing device includes an array of light sensing elements where each light sensing element includes a photodiode and multiple control transistors. The control transistors include at least a transfer gate transistor and a reset transistor. The transfer gate transistor has a drain terminal being a floating diffusion node and a source terminal coupled to the photodiode. The reset transistor has a drain terminal coupled to a reset level voltage and a source terminal coupled to the floating diffusion node. Each light sensing element generates an output pixel voltage indicative of an intensity level of light impinging on the photodiode. The control transistors are configured to control reset, light integration, charge transfer and data read operations of each light sensing element. In operation, the light sensing element is configured to selectively operate in a first operation mode for high conversion gain or a second operation mode for low conversion gain. The reset level voltage is a positive power supply voltage in the first operation mode and the reset level voltage is a voltage slightly less than a pinning voltage of the photodiode in the second operation mode. Furthermore, in the second operation mode, the photodiode and the floating diffusion node are reset to about the same voltage potential and are reset to a voltage potential below the pinning voltage during the reset operation of the light sensing element.

According to another aspect of the present invention, a method in an image sensing device includes providing an array of light sensing elements where each light sensing element includes a photodiode and multiple control transistors. The control transistors include at least a transfer gate transistor and a reset transistor where the transfer gate transistor has a drain terminal being a floating diffusion node and a source terminal coupled to the photodiode and the reset transistor has a drain terminal coupled to a reset level voltage and a source terminal coupled to the floating diffusion node. The control transistors are configured to control reset, light integration, charge transfer and data read operations of each light sensing element. The method further includes generating at each light sensing element an output pixel voltage indicative of an intensity level of light impinging on the photodiode, operating one or more light sensing elements in a first operation mode for high conversion gain or a second operation mode for low conversion gain, providing a positive power supply voltage for the reset level voltage to operate a light sensing element in the first operation mode, providing a voltage slightly less than a pinning voltage of the photodiode to operate a light sensing element in the second operation mode, and resetting one or more light sensing elements in the second operation mode where the photodiode and the floating diffusion node are reset to about the same voltage potential and are reset to a voltage potential below the pinning voltage.

The present invention is better understood upon consideration of the detailed description below and the accompanying drawings.

DETAILED DESCRIPTION OF THE PREFERRED EMBODIMENTS

In accordance with the principles of the present invention, an image sensor including an array of pixel elements is operated according to two or more operation modes to modulate the conversion gain of the pixel. More specifically, the conversion gain (CG) of the pixel is altered by operating the pixel in at least two different operation modes based on the impinging light conditions so that conversion gain modulation is achieved without additional pixel circuitry or introducing additional parasitic capacitances. In some embodiments, the conversion gain of the pixel is modulated by charge sharing between the floating diffusion and the photodiode.

In embodiments of the present invention, the pixel is operated in one of two operation modes to modulate the conversion gain. A high conversion gain (high CG) mode is used for low light conditions while a low conversion gain mode is used for bright light conditions. In particular, in low light conditions, the floating diffusion (FD) capacitance is minimized to maximize the conversion gain, thereby achieving high sensitivity. However, in bright light conditions, the pixel is operated in a low conversion gain mode (low CG), also referred to as the charge sharing mode (CSM), in which the photodiode not only provides the photon to electron conversion, but also provides charge storage. In this manner, the effective floating diffusion capacitance is maximized while minimizing the conversion gain, thereby effectively increasing the overall storage capability of the pixel while reducing the sensitivity in bright light conditions. In some embodiments, the photodiode provides some of the electron to voltage conversion as well.

Selection between the operation modes can be accomplished automatically using data describing the light levels impinging on the image sensor. Alternately, the operation modes can be selected manually by user input. In one embodiment, the image sensor selects the low CG or high CG mode using control data from the imaging system incorporating the image sensor. The control data indicates the light level of the incident light. For example, control data from the automatic gain control (AGC) of the imaging system may be used for mode selection. In some embodiments, the image sensor may use data from certain pixels of the pixel array as an indicator of the light conditions. In this manner, the mode selection can be performed on the array level or on a region-by-region basis, as described in more detail below.

Operation Modes Overview

Figure 1:
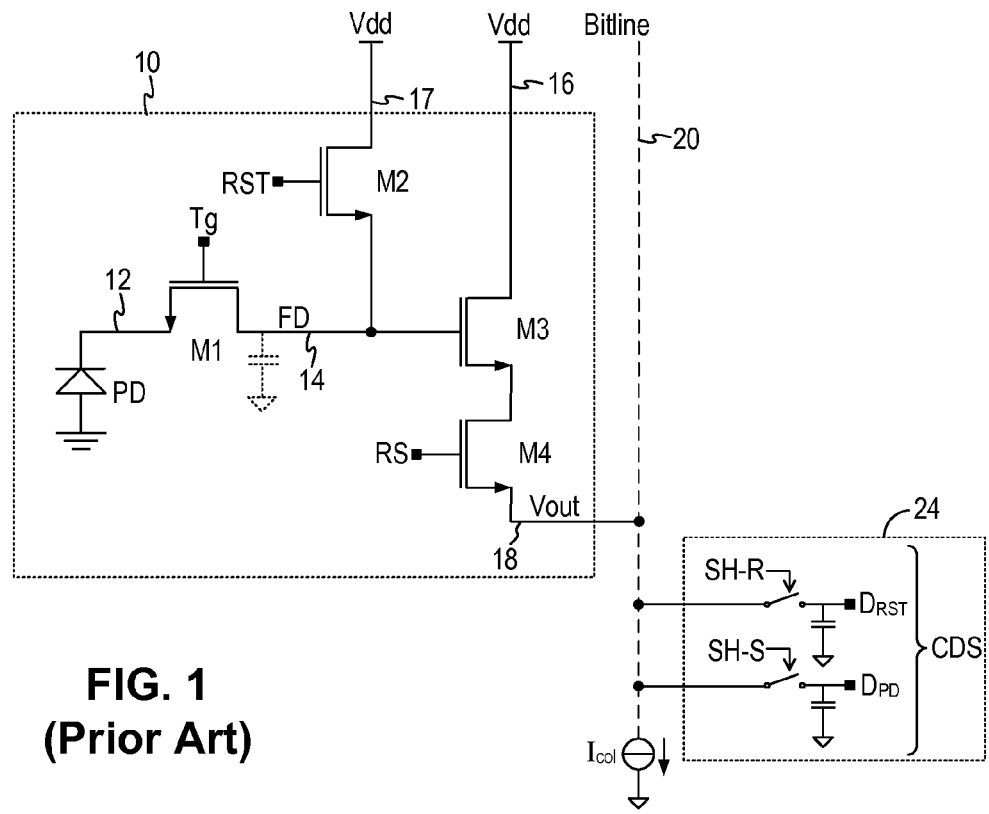
FIG. 1 is a schematic diagram of a conventional 4T CMOS image sensor pixel.
Figure 2:
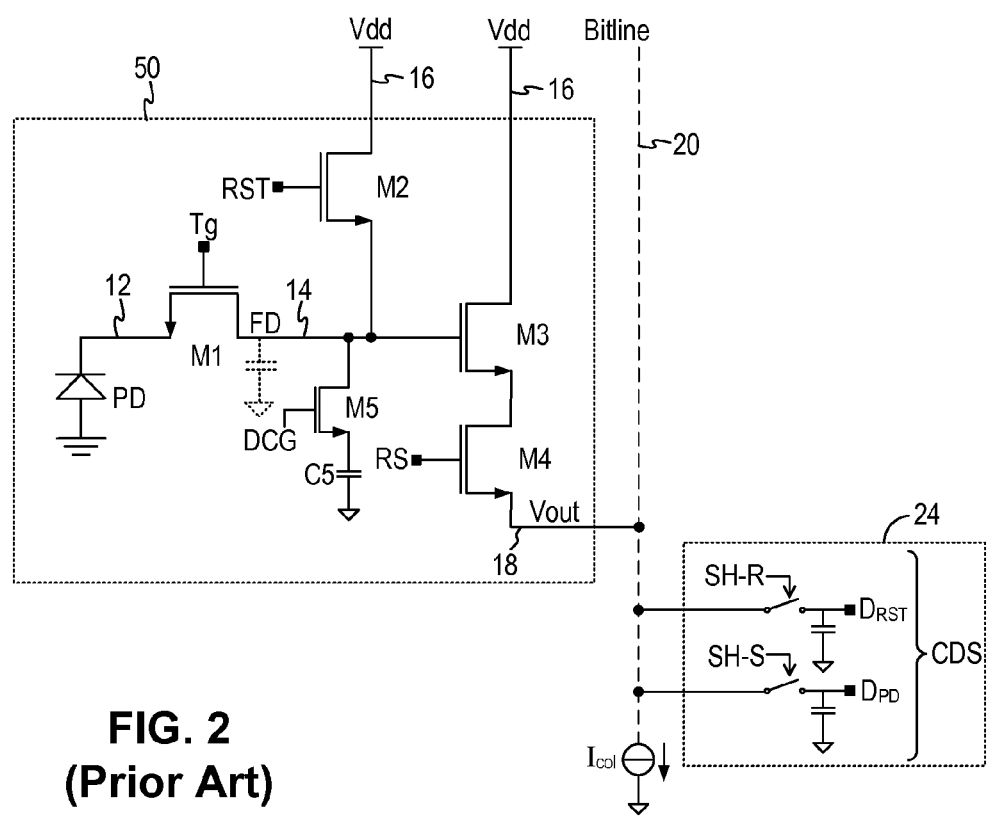
FIG. 2 is a schematic diagram of a conventional 4T CMOS image sensor pixel with dual conversion gain obtained with an extra capacitor and transistor.
Figure 3:
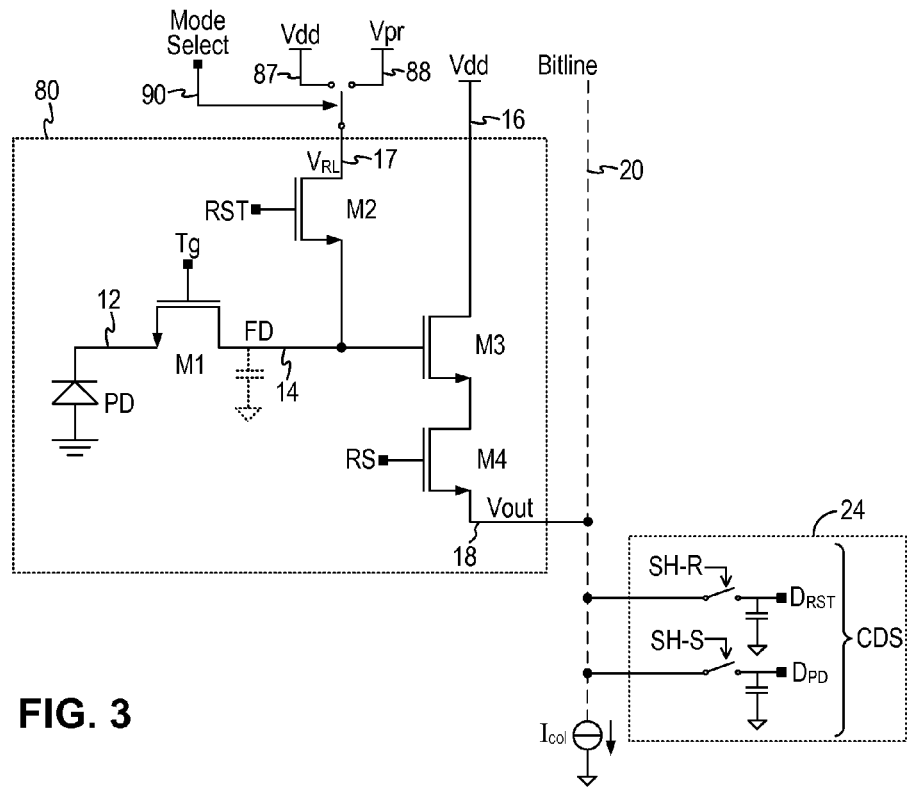
FIG. 3 is a schematic diagram of a 4T CMOS image sensor pixel configured for conversion gain modulation according to one embodiment of the present invention.
Figure 4:
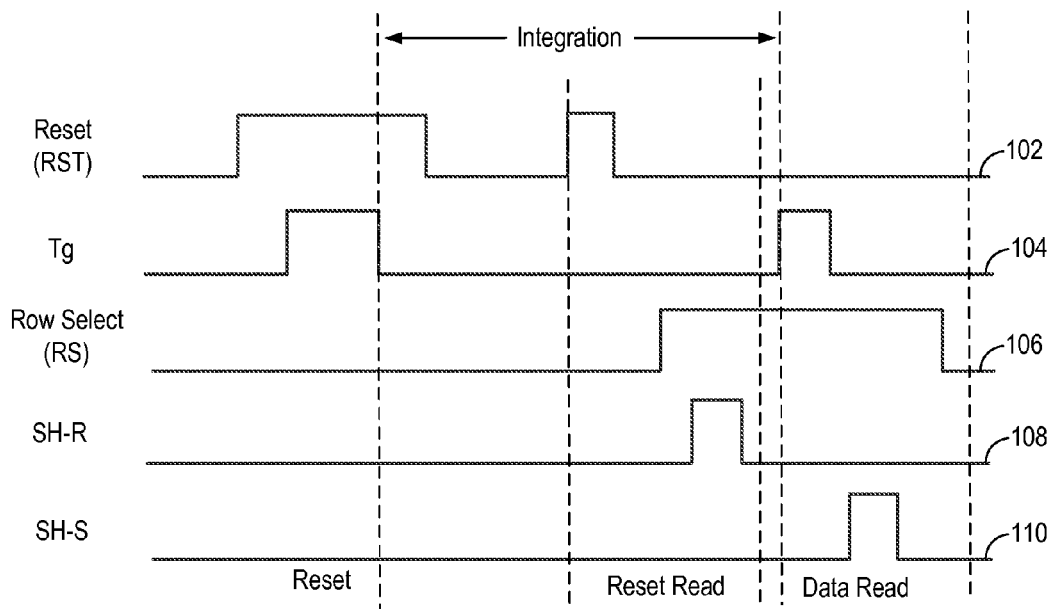
FIG. 4 is a timing diagram for the 4T pixel circuit of FIG. 3 when operating in the high CG mode according to one embodiment of the present invention.

FIG. 3 is a schematic diagram of a 4T CMOS image sensor pixel configured for conversion gain modulation according to one embodiment of the present invention. In the present description, a CMOS image sensor pixel with a non-shared readout scheme, as shown in FIGS. 3 and 4, is used to describe the conversion gain modulation in accordance with embodiments of the present invention. The use of a non-shared readout scheme for the image sensor pixel is illustrative only. The conversion gain modulation scheme of the present invention can be applied to other pixel architecture and layouts, including a shared read output scheme where two or more photodiodes share the same floating diffusion node. Also, the conversion gain modulation scheme of the present invention can be applied to other readout schemes including digital pixel readout.

Referring to FIG. 3, a pixel circuit 80 implementing a 4T active pixel design includes a photodiode (PD) and four control transistors M1 to M4. In the present embodiment, control transistors M1 to M4 are NMOS transistors and operate in concert to control the reset, light integration, charge transfer and data read operations of the pixel element. More specifically, transistor M2 is the reset transistor controlled by a reset signal (RST); transistor M4 is the row select transistor controlled by a row select signal (RS); transistor M1 is the transfer gate controlled by a transfer gate signal (Tg); and finally, transistor M3 is gated by the floating diffusion FD (node 14) to sense the charge transferred from the photodiode PD. The 4T pixel circuit 80 can be used to form an image sensor including a one-dimensional or a two-dimensional array of light sensing elements or pixel elements, each pixel element being constructed as the 4T pixel circuit 80.

The basic operation of the 4T pixel circuit 80 is as follows. In the 4T active pixel element 80, when both the reset signal RST and the transfer gate signal Tg are set to a logical high level, the photodiode PD is reset to a voltage determined by the reset level voltage $V_{RL}$ at the drain terminal (node 17) of the reset transistor M2. When the reset level voltage $V_{RL}$ is set to the power supply voltage Vdd, the photodiode PD is reset to its pinning voltage, which is typically in the 0.8 to 1.5 volt range dependent on the fabrication technology. In a conventional pixel circuit, the drain terminal (node 17) of the reset transistor M2 is connected directly to the power supply voltage Vdd. However, in embodiments of the present invention, in pixel circuit 80, the reset level voltage $V_{RL}$ is switchably connected to the Vdd voltage (node 87) and a partial reset voltage Vpr (node 88) to implement multiple operation modes for conversion gain modulation, as will be described in more detail below. In some embodiments, the source follower transistor M3 and the reset transistor M2 have their drain terminals connected to separate voltage supplies, as shown in FIG. 3.

After the photodiode reset operation is completed, the reset signal RST returns to a low state. Then, when the transfer gate signal Tg goes low and the transfer gate M1 is turned off, the photodiode PD is isolated from the rest of the circuit and the photodiode is in a state operative to integrate photons from the incident light, i.e. the photodiode is charged in response to incident light. The photodiode is therefore operated in the light integration period. Meanwhile, the reset voltage value, present on the floating diffusion FD node 14, can be read out of the pixel element. To read the reset voltage value, the reset signal RST is kept low and reset transistor M2 is kept off. Meanwhile, the row select signal RS is switched high and the row select transistor M4 is turned on to connect the reset voltage at the floating diffusion FD, through transistors M3, to the output voltage node 18 as the output pixel voltage Vout. The output pixel voltage Vout is passed to a bitline 20 which may be biased by a current source providing a current $I_{col}$. From the bitline 20, the reset voltage may be stored at a circuit external to the pixel array for use in the operations of the pixel array, such as for cancellation of the reset voltage values. The reset voltage on bitline 20 may also be provided to an analog-to-digital converter (ADC) formed outside of the pixel array to digitize the sensed voltage value before storing the reset voltage value.

In the present illustration, an analog storage circuit 24 coupled to bitline 20 is used to store the reset voltage value and also the pixel voltage value provided on the bitline 20. In the present embodiment, the analog storage circuit 24 is implemented as a sample-and-hold circuit where a first switch connects the bitline to a first capacitor and a second switch connects the bitline to a second capacitor. A control signal SH-R controls the first switch to sample the reset voltage value onto the first capacitor. A control signal SH-S controls the second switch to sample the light-dependent pixel voltage value onto the second capacitor. The analog storage circuit 24 stores the sampled output pixel voltage Vout sensed on bitline 20 on their respective capacitors. When the reset voltage value is presented on bitline 20 and control signal SH-R is asserted, a pixel reset value $D_{RST}$ is sampled onto the first capacitor.

At the end of the light integration period, the charge collected by the photodiode can be read out. To do so, the transfer gate signal Tg is switched high to turn on the transfer gate transistor M1 to transfer the charge from the photodiode PD (node 12) to the floating diffusion FD (node 14). In conventional operation, the transfer gate signal Tg is switched low to turn off the transfer gate M1 after the charge has been transferred so as to isolate the floating diffusion from the photodiode. Readout of the light dependent pixel voltage then proceeds by setting the row select signal RS to high to turn on row select transistor M4. The pixel voltage value is then provided through transistor M3 to the output voltage node 18 as the output pixel voltage Vout. The pixel voltage value is passed to the bitline 20. In the present illustration, the light-dependent pixel voltage value is stored in the analog storage circuit 24. More specifically, the control signal SH-S controlling the second switch in the analog storage circuit 24 is asserted to sample the pixel voltage value onto the second capacitor. The output pixel voltage Vout on bitline 20 is then converted to a light dependent pixel value $D_{PD}$. In some embodiments, correlated double sampling (CDS) may be implemented where the pixel reset value previously recorded is cancelled from the light dependent pixel value to generate a corrected output pixel value without noise or errors due to non-uniformity of the pixel elements in the array.

The 4T CMOS image sensor pixel circuit 80 in FIG. 3 has the same transistor configuration as a conventional 4T pixel. However, in accordance with embodiments of the present invention, the drain terminal (node 17) of the reset transistor M2 is configured to be switchably connected to either the positive power supply voltage Vdd (node 87) of the image sensor or to a partial reset voltage Vpr (node 88). The partial reset voltage Vpr has a voltage value slightly less than the pinning voltage Vpin. The voltage at the drain terminal (node 17) of reset transistor M2 establishes the reset level of the photodiode and the voltage is referred to herein as the reset level voltage $V_{RL}$. The reset level voltage $V_{RL}$ determines the operation mode of the pixel circuit 80. When the reset level voltage $V_{RL}$ is connected to the power supply voltage Vdd (node 87), the pixel circuit 80 is operated in the high CG mode. When the reset level voltage $V_{RL}$ is connected to the partial reset voltage Vpr (node 88), the pixel circuit 80 is operated in the low CG mode. In embodiments of the present invention, voltage selection for the reset level voltage $V_{RL}$ is realized by a mode select signal 90. The mode select signal 90 can be generated by automatic control based on the light level sensed by the image sensor. Alternately, the mode select signal 90 can be generated by manual selection through user input.

In embodiments of the present invention, the pixel circuit 80 is operated in the high CG mode in low light conditions where the FD capacitance is minimized. In the high CG mode, the reset level voltage VRL (node 17) is connected to the power supply Vdd voltage node 87. The high CG mode uses the conventional 4T pixel timing, in which the photodiode is reset and readout in a conventional manner, as shown in the timing diagram of FIG. 4 for a 4T pixel. In FIG. 4, the reset signal RST is shown by curve 102, the transfer gate signal Tg is shown by curve 104, the row select signal RS is shown by curve 106, the control signal SH-R is shown by curve 108 and the control signal SH-S is shown by curve 110.

Referring to FIG. 4, the conventional 4T pixel timing involves resetting the photodiode to its pinning voltage (Vpin) during the Reset period. Then, light integration starts when the transfer gate signal Tg is deasserted. During the light integration period, the pixel reset voltage value may be read out during a Rest Read period. Then after light integration, the transfer gate (Tg) is turned on to transfer the entire collected charge on the photodiode (PD) to the floating diffusion (FD). After all charge has been transferred, the transfer gate is turned off, and the floating diffusion (FD) is read out during the Data Read period.

Figure 5:
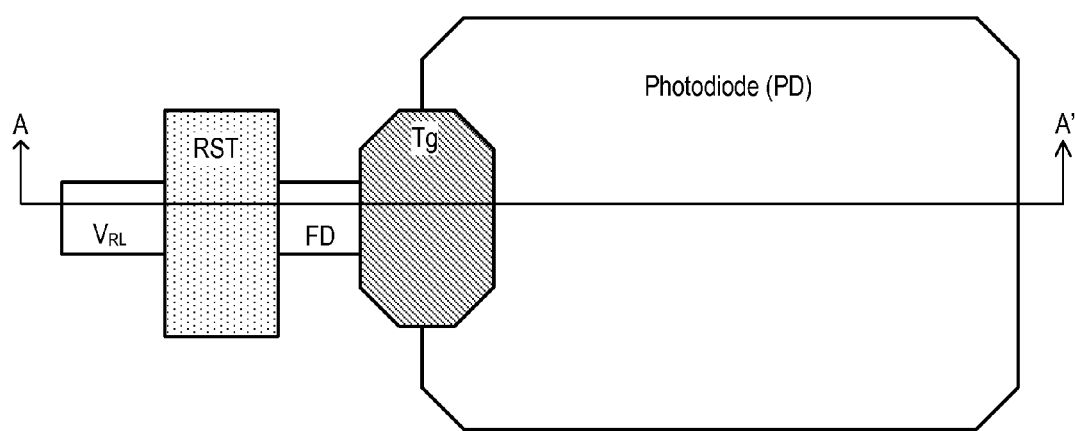
FIG. 5 is a top view of a layout of a 4T CMOS image sensor pixel according to one embodiment of the present invention.

The operation of the 4T pixel circuit 80 can be further described using potential diagrams illustrating the voltage levels at different nodes of the pixel circuit. FIG. 5 is a top view of a layout of a 4T CMOS image sensor pixel according to one embodiment of the present invention. Referring to FIG. 5, the transfer gate transistor (with control signal Tg) is formed between the floating diffusion FD and the photodiode PD of the pixel circuit. The reset transistor gate is formed between the floating diffusion FD and a diffusion being the drain terminal of the reset transistor receiving the reset level voltage $V_{RL}$. FIG. 5 illustrates a representative layout of the pixel circuit and is not intended to be limiting. In the following description, potential diagrams of the pixel circuit 80 across the cross-section line A-A' under different operating conditions are provided to illustrate the operation of the pixel circuit. In the present description, the potential diagrams are illustrative only and are not intended to be an absolutely technically correct representation of the energy potentials at different parts of the image sensor pixel. Rather, the potential diagrams are provided mainly to demonstrate pictorially the potential values and changes in potential values of different parts of the image sensor pixel during various pixel operations.

Figure 6:
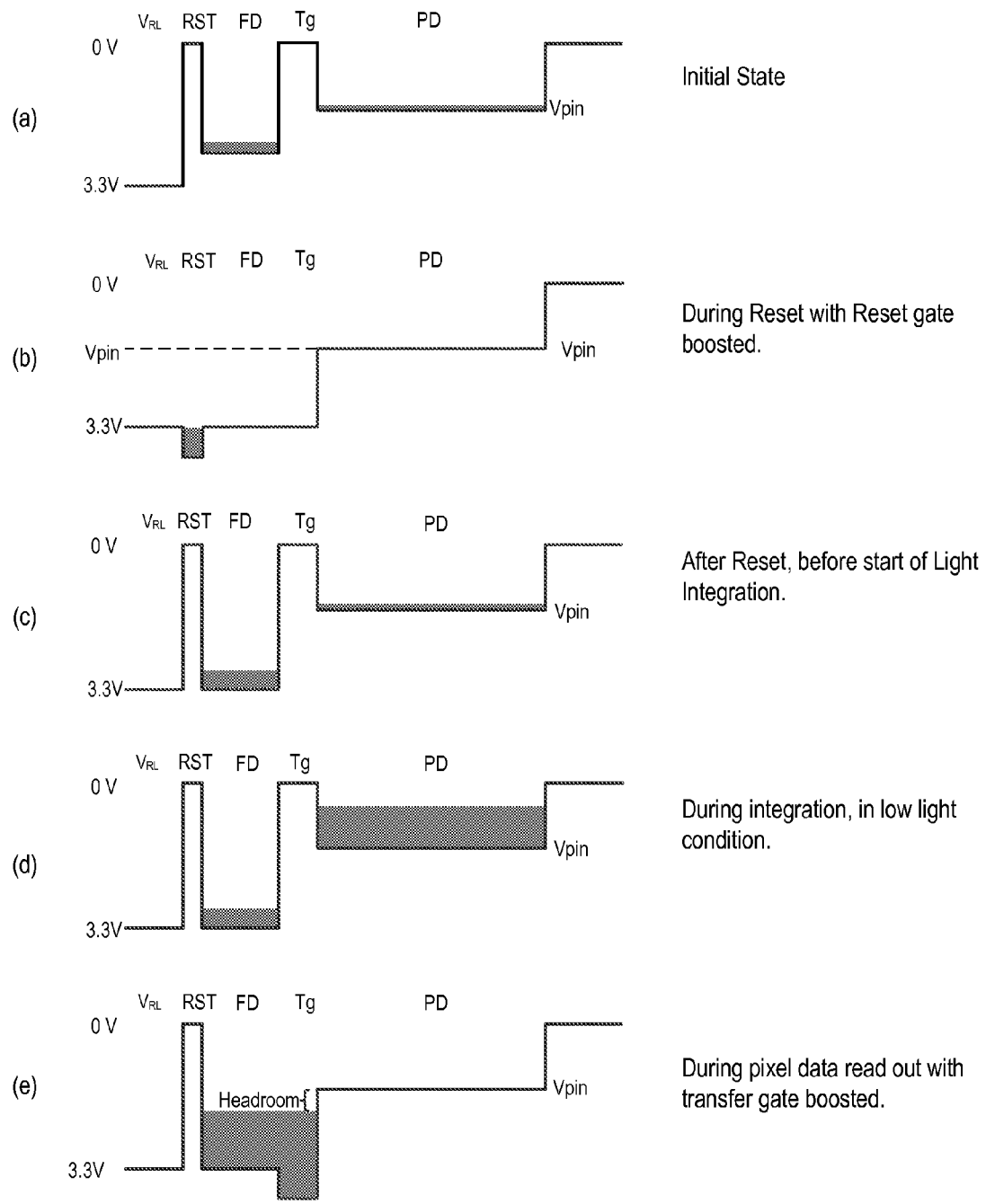
FIG. 6, which includes FIGS. 6(*a*) to 6(*e*), illustrates the potential diagrams of the 4T pixel circuit of FIG. 3 when operating in the high CG mode according to one embodiment of the present invention.

FIG. 6, which includes FIGS. 6(*a*) to 6(*e*), illustrates the potential diagrams of the 4T pixel circuit of FIG. 3 when operating in the high CG mode according to one embodiment of the present invention. In the present illustration, the positive power supply voltage Vdd of the pixel circuit is assumed to be 3.3V. Referring to FIG. 6, the pixel circuit in an initial state (FIG. 6(a)) may have undetermined voltage values at the photodiode PD and the floating diffusion FD. Thus, before any light integration process, the photodiode PD needs to be reset. The reset operation is carried out by asserting the reset signal RST and the transfer gate signal Tg to a logical high level, that is to the Vdd voltage (3.3V). The reset transistor and the transfer gate transistor are both turned on. In the high CG mode of operation, the reset level voltage $V_{RL}$ is coupled to the power supply Vdd voltage (3.3V) and thus the drain terminal of the reset transistor is connected to the Vdd voltage. In the present illustration, the reset signal RST is boosted so that the reset transistor has a gate voltage larger than the Vdd voltage. During the reset operation, the floating diffusion FD is electrically shorted to the reset level voltage $V_{RL}$ and the photodiode PD is emptied of charge. The photodiode PD is reset to its pinning voltage Vpin while the floating diffusion FD is reset to the Vdd voltage. The photodiode PD and floating diffusion FD are thus set to different potentials, as shown in FIG. 6(b). After the reset operation, the reset signal RST is deasserted and the transfer gate signal Tg is also deasserted, as shown in FIG. 6(c). The photodiode PD is therefore isolated from the floating diffusion FD. Light integration can then begin and the photodiode PD collects charge from the impinging light, as shown in FIG. 6(d).

After the light integration operation, the charged collected at the photodiode PD can be read out, as shown in FIG. 6(e). The transfer gate signal Tg is asserted and the charge collected by the photodiode PD are transferred to the floating diffusion through the channel of the transfer gate transistor. In the present illustration, the transfer gate signal Tg is boosted to a value greater than the Vdd voltage. The data read out process is complete when all the charge collected by the photodiode has been transferred to the floating diffusion. In the present embodiment, a voltage headroom—being FD potential minus Vpin—should be large enough to keep current flowing from the photodiode PD, and to prevent backwash of electrons into the photodiode PD when the transfer gate signal Tg is turned off.

The potential diagrams of FIG. 6 illustrate the operation of the 4T pixel circuit 80 of FIG. 3 under the high CG mode where the floating diffusion capacitance is minimized to optimize the sensitivity of the pixel. In embodiments of the present invention, the 4T pixel circuit 80 can also be operated under the low CG mode where the floating diffusion capacitance is maximized in a charge sharing mode to improve bright light sensing.

The low CG mode of operation for bright light conditions uses charge sharing between the photodiode PD and floating diffusion FD to increase the effective capacity of the floating diffusion. The low CG mode is used in bright light conditions requiring a floating diffusion capacity that would ordinarily be too high for a high conversion gain/low capacitance floating diffusion need for low light conditions. A key aspect of the low CG mode is to reset the pixel circuit such that the photodiode and the floating diffusion are at substantially the same potential and are below the pinning voltage (Vpin) of the photodiode.

Figure 7:
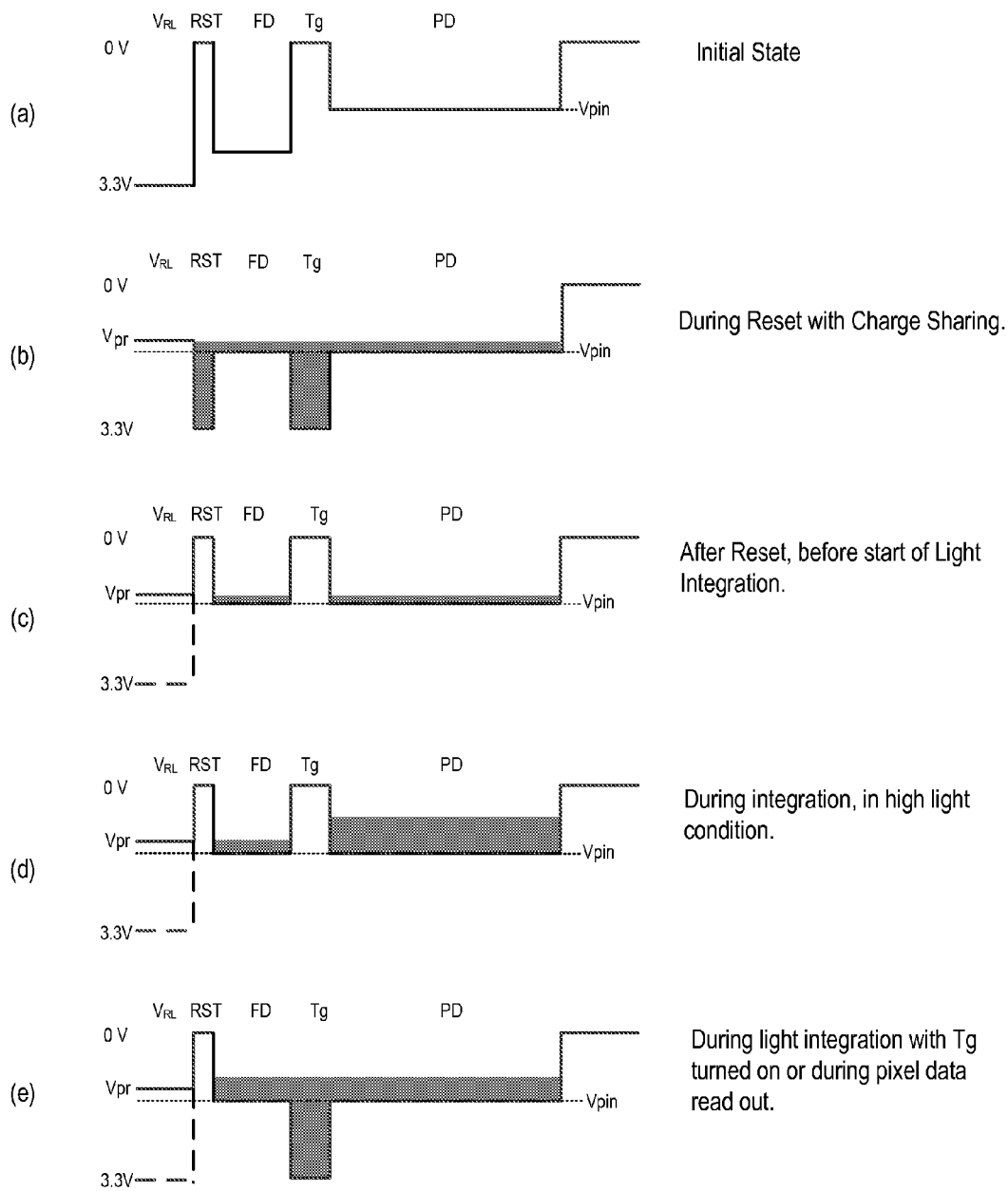
FIG. 7, which includes FIGS. 7(*a*) to 7(*e*), illustrates the potential diagrams of the 4T pixel circuit of FIG. 3 when operating in the low CG mode according to one embodiment of the present invention.

FIG. 7, which includes FIGS. 7(a) to 7(e), is a potential diagram of the 4T pixel circuit of FIG. 3 when operating in the low CG mode according to one embodiment of the present invention. In the illustration shown in FIG. 7, as in FIG. 6, the positive power supply voltage Vdd of the pixel circuit is assumed to be 3.3V. Referring to FIG. 7, the pixel circuit in an initial state (FIG. 7(a)) may have undetermined voltage values at the photodiode PD and the floating diffusion FD. Thus, before any light integration process, the photodiode PD needs to be reset. The reset operation is carried out by asserting the reset signal RST and the transfer gate signal Tg to a logical high level, that is to the Vdd voltage (3.3V), as shown in FIG. 7(b). The reset transistor and the transfer gate transistor are both turned on. In the low CG mode of operation, the reset level voltage $V_{RL}$ is coupled to the partial reset voltage Vpr so that the drain terminal of the reset transistor is connected to the Vpr voltage which has a voltage value slightly less than the pinning voltage Vpin. In the present embodiment, the partial reset voltage Vpr is about 1.25V. During the reset operation, the floating diffusion FD is electrically shorted to the reset level voltage $V_{RL}$ having the partial voltage Vpr value and further shorted to the photodiode PD. Accordingly, the photodiode PD and the floating diffusion FD are reset to the same bias level and the bias level is slightly below the photodiode pinning voltage Vpin, As shown in FIG. 7(b). Resetting the photodiode and the floating diffusion to a Vpr voltage level slightly below the pinning voltage is referred herein as a "partial reset" operation.

After the partial reset operation, the reset signal RST is deasserted and the transfer gate signal Tg is also deasserted, as shown in FIG. 7(c). The photodiode PD is therefore isolated from the floating diffusion FD. Light integration can then begin and the photodiode PD collects charge from the impinging light, as shown in FIG. 7(d).

After light integration, the charged collected at the photodiode PD can be read out, as shown in FIG. 7(e). The transfer gate signal Tg is asserted and the charge collected by the photodiode PD are transferred to the floating diffusion through the channel of the transfer gate transistor. However, in the low CG operation mode, the transfer gate remains turned on during the signal read phase so that the combined signal at the floating diffusion FD, the transfer gate transistor and the photodiode PD is read out. Since the floating diffusion and photodiode were reset to substantially the same voltage, after the transfer gate is turned on, the charge equilibrates between the floating diffusion FD and the photodiode PD, rather than transferring entirely to the floating diffusion FD. The combined PD/transfer gate/FD structure then acts as the read out node, providing a large charge storage.

In some embodiments, the transfer gate remains normally off during light integration, but is periodically switched on to partially transfer charge to the floating diffusion in advance of charge read out. The transfer gate is then kept on during readout, but is turned off again when readout is completed. In other embodiments, the transfer gate can be turned on periodically to implement multi-sampling readouts, as will be explained in more detail below.

In other embodiments, the transfer gate remains normally off during light integration, but is periodically switched on to partially transfer charge to the floating diffusion in advance of charge readout. In this mode, the transfer gate is switched off prior to readout so that readout occurs with higher conversion gain. May other operation modes are possible for implementing the low CD operation modes, as will be explained in more detail below.

Low CG/Charge Sharing Mode

The operation of the low CG mode, also referred to as the charge sharing mode (CSM), for bright light conditions will now be described in more details.

First, the pinning voltage of a photodiode is described. In the present description, the photodiode's pinning voltage refers to the voltage applied to the photodiode at which the photo collection region of the photodiode is fully depleted.

More specifically, a photodiode is a PN junction or PIN junction. The photo collection region of the photodiode is an n-type region sandwiched between a surface p-type region and an epi/bulk p-type region. When a positive bias is applied to the n-type photo collection region, depletion regions form at the two n/p interfaces. As positive bias is increased, the depletion region from n/surface p becomes deeper, while the depletion region from the n/epi p moves to the surface. At a certain bias voltage, the two depletion regions meet and the n-type photo collection region is fully depleted. That bias voltage is the pinning voltage of the photodiode.

In CSM operation, the photodiode PD is partially reset to a voltage less then the photodiode's pinning voltage Vpin. More specifically, in the low CG or CSM mode, the photodiode is reset to the partial reset voltage (Vpr) which is less than the photodiode pinning voltage and the photodiode is therefore not fully depleted. Furthermore, the FD is reset to substantially the same voltage as the photodiode PD, as shown in the potential diagram of FIG. 7(b). This reset operation is referred to as the "partial reset" operation. Partial reset is accomplished by setting the drain voltage ($V_{RL}$) of the reset transistor M2 to the partial reset voltage Vpr which is below the PD pinning voltage Vpin. Then, the reset signal RST is set to a voltage higher than Vpr+$V_t$ to reset the floating diffusion FD ($V_t$ denotes the threshold voltage of the NMOS transistors in the pixel circuit). Meanwhile, the transfer gate transistor is set to a voltage higher than Vpr+$V_t$ to reset the photodiode PD. When partial reset is used, the photodiode PD noise can be higher, and low light FPN (fixed pattern noise) may be higher (due to dependence on the reset transistor drain voltage). However, because the low CG mode is used primarily for bright light conditions, these artifacts will be negligible.

In embodiments of the present invention, there are two readout schemes that can be used with the CSM operation: single read out per frame, or multiple readouts per frame (which can be applicable to a digital pixel which generates digital output data at each pixel). Each of these readout schemes can be further broken down into whether the transfer gate signal Tg is held closed during integration and/or readout. In the following description, six readout schemes under the CSM operation are described. The description provided herein is illustrative only and not intended to be limiting. One of ordinary skill in the art, upon being apprised of the present description, would appreciate that the CSM mode and the partial reset operation can be applied to various pixel timing schemes and pixel readout schemes to modulate the conversion gain for high and low light conditions.

Single Readout Schemes

Mode A1

In a first embodiment, a first CSM operating mode (Mode A1) is configured for single read out per frame with the transfer gate signal Tg set low during integration and set high during readout.

Figure 8:
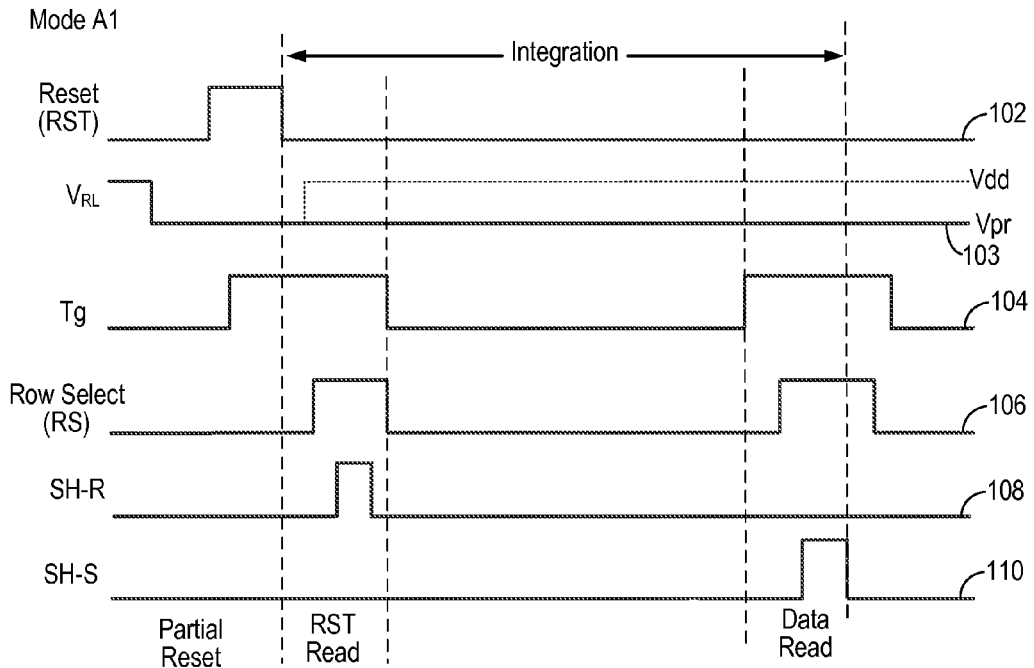
FIG. 8 is a timing diagram for CSM Operation Mode A1, utilizing single readout, with the transfer gate set low during the integration time according to one embodiment of the present invention.

FIG. 8 is a timing diagram for CSM Operation Mode A1, utilizing single readout, with the transfer gate set low during the integration time according to one embodiment of the present invention. Under Mode A1 operation, a partial reset is performed by asserting the reset signal RST (curve 102) to turn on the reset transistor and asserting the transfer gate signal Tg (curve 104) to turn on the transfer gate transistor. The reset level voltage $V_{RL}$ is set to the partial reset voltage (curve 103). Accordingly, the photodiode and the floating diffusion are reset to the same potential which is a voltage value that is slightly less than the pinning voltage of the photodiode.

Light integration begins when the reset signal RST is deasserted. The transfer gate Tg remains asserted to allow the reset voltage value to be read out. More specifically, during the reset read period (RST Read), the row select signal RS (curve 106) and the control signal SH-R (curve 108) are asserted in turn to read out the reset voltage value at the PD/Tg/FD node. The transfer gate signal Tg is deasserted after the reset read operation.

When light integration is complete, the reset signal RST is kept low, while the transfer gate signal Tg is set high. Charge collected by the photodiode is then distributed to the floating diffusion. In some embodiments, the transfer gate signal Tg may be boosted to minimize lag. Boosting involves raising the transfer gate signal Tg which is the gate voltage of the transfer gate transistor above the power supply voltage Vdd. After the floating diffusion FD charge reaches steady state, the transfer gate signal Tg remains asserted (logical high) while the pixel data is read out. More specifically, during the data read period, the row select signal RS (curve 106) and the control signal SH-S (curve 110) are asserted in turn to read out the light-dependent pixel voltage value at the PD/Tg/FD node. The transfer gate signal Tg is deasserted after the data read operation. A partial reset can then performed to start the next frame.

Under mode A1, the transfer gate signal Tg is kept on during signal read. Also, mode A1 requires that the reset read (RST read) be carried out immediately after the partial reset. As thus configured, mode A1 will have a full well proportional to the sum of the PD and FD capacities at voltage Vpr. The conversion gain will be inversely proportional to the sum of the PD, FD, and Tg capacitances.

Mode A2

In a second embodiment, a second CSM operating mode (Mode A2) is configured for single readout with the transfer gate signal Tg set high during integration and read out.

Figure 9:
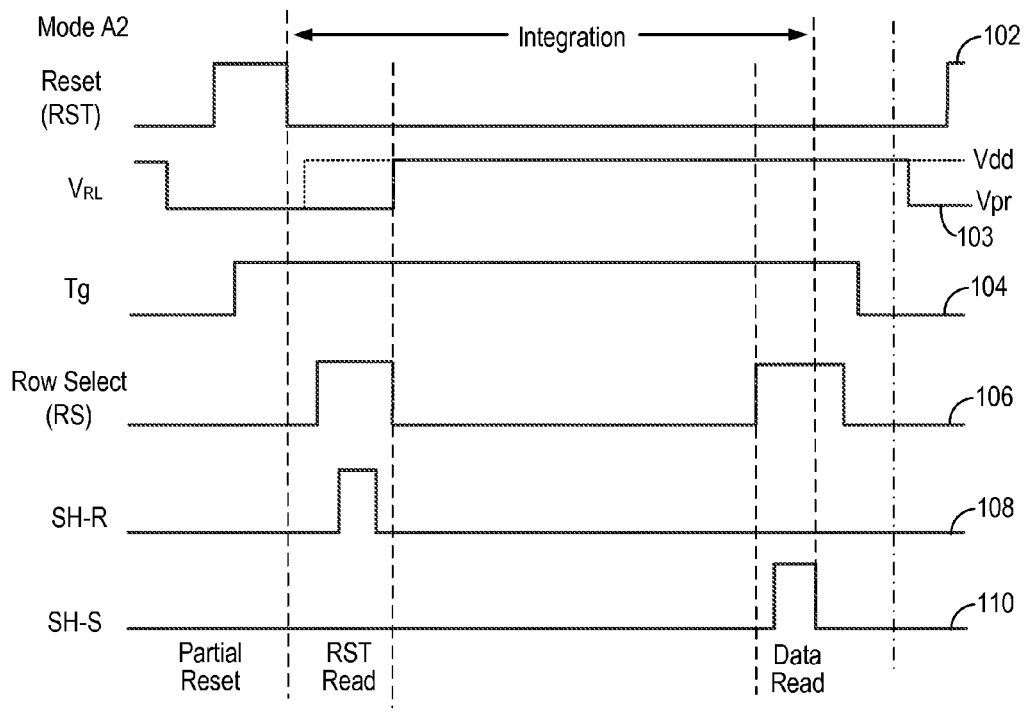
FIG. 9 is a timing diagram for CSM Operation Mode A2, utilizing single readout, with the transfer gate set high during integration and readout according to one embodiment of the present invention.

FIG. 9 is a timing diagram for CSM Operation Mode A2, utilizing single readout, with the transfer gate set high during integration and readout according to one embodiment of the present invention. Under Mode A2 operation, a partial reset is performed by asserting the reset signal RST (curve 102) to turn on the reset transistor and asserting the transfer gate signal Tg (curve 104) to turn on the transfer gate transistor. The reset level voltage $V_{RL}$ is set to the partial reset voltage (curve 103). Accordingly, the photodiode and the floating diffusion are reset to the same potential which is a voltage value that is slightly less than the pinning voltage of the photodiode.

Light integration begins when the reset signal RST is deasserted. The transfer gate Tg remains asserted to allow the reset voltage value to be read out during the RST Read period. Furthermore, contrary to Mode A1 operation, the transfer gate signal Tg remains asserted after the reset read operation and remains asserted during the entire light integration period. In this manner, charge collected by the photodiode is continuously distributed between the photodiode and the floating diffusion throughout the integration period.

Light integration is complete when data read is performed. During data read period, the reset signal RST is kept low, the transfer gate signal Tg is kept high. The row select signal RS (curve 106) and the control signal SH-S (curve 110) are asserted in turn to read out the light-dependent pixel voltage value at the PD/Tg/FD node. The transfer gate signal Tg is deasserted after the data read operation. A partial reset can then performed to start the next frame.

In mode A2 operation, after the partial reset is performed, the reset level voltage $V_{RL}$ may be set to the power supply Vdd voltage or may remain at the partial reset voltage.

Similar to Mode A1, Mode A2 requires that the reset read (RST read) be carried out immediately after the partial reset.

Mode A2 will have a full well proportional to the sum of the PD and FD capacities at Vpr, as well as the Tg capacity at the transfer gate "on" bias voltage. The conversion gain will be inversely proportional to the sum of the PD, FD, and Tg capacitances.

Mode A3

In a third embodiment, a third CSM operating mode (Mode A3) is configured for single readout with the transfer gate signal Tg set low during integration and read out.

Figure 10:
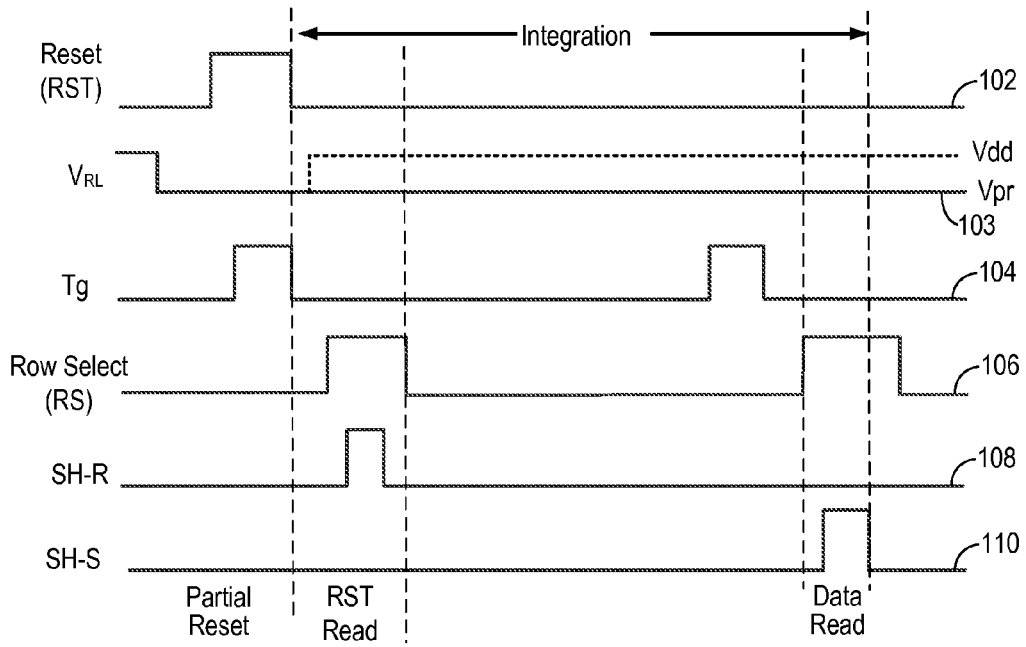
FIG. 10 is a timing diagram for CSM Operation Mode A3, utilizing single readout, with the transfer gate set low during integration and readout according to one embodiment of the present invention.

FIG. 10 is a timing diagram for CSM Operation Mode A3, utilizing single readout, with the transfer gate set low during integration and readout according to one embodiment of the present invention. Under Mode A2 operation, a partial reset is performed followed by the reset read operation. The transfer gate signal Tg is deasserted after the partial reset and before the reset read. Light integration starts when the transfer gate signal is deasserted until the data read operation. Following integration, the transfer gate signal Tg is pulsed high to transfer charge from the photodiode to the floating diffusion. When the photodiode PD and the floating diffusion FD have reached a new potential equilibrium, the transfer gate Tg is deasserted, and the floating diffusion FD is read out during the data read period.

In mode A3 operation, after the partial reset is performed, the reset level voltage $V_{RL}$ may be set to the power supply Vdd voltage or may remain at the partial reset voltage.

Similar to Mode A1, Mode A3 requires that the reset read (RST read) be carried out immediately after the partial reset. In Mode A3, the full well will be proportional to the PD capacity at Vpr, while CG will be inversely proportional to FD plus PD capacitance.

Multi-Readout Schemes

Mode B1

In a fourth embodiment, a fourth CSM operating mode (Mode B1) is configured for multi-readout with transfer gate signal Tg set high. Mode B1 is an extension of Mode A2 to multi-readout per frame.

Figure 11:
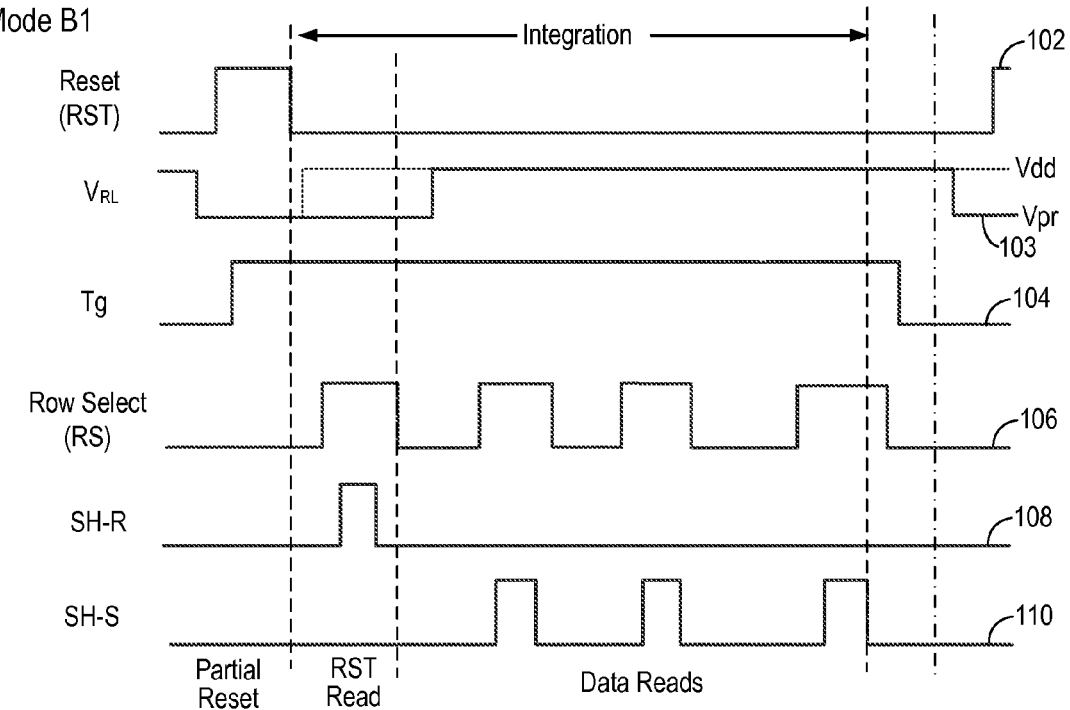
FIG. 11 is a timing diagram for CSM Operation Mode B1, utilizing multi-readout, with the transfer gate always high according to one embodiment of the present invention.

FIG. 11 is a timing diagram for CSM Operation Mode B1, utilizing multi-readout, with the transfer gate always high according to one embodiment of the present invention. Mode B1 operates in the same manner as mode A2 where a partial reset is carried out and light integration begins when the reset signal RST is deasserted. In Mode B1, the transfer gate Tg remains asserted after partial reset to allow the reset voltage value to be read out during the RST Read period. Furthermore, the transfer gate signal Tg remains asserted after the reset read operation and remains asserted during the entire light integration period. In this manner, charge collected by the photodiode is continuously distributed between the photodiode and the floating diffusion throughout the integration period.

Under Mode B1, during the light integration period, with the transfer gate signal Tg asserted high, the row select signal RS (curve 106) and the control signal SH-S (curve 110) are periodically asserted to read out multiple samples of the light-dependent pixel voltage value at the PD/Tg/FD node. In this manner, multiple sampling of the light-dependent pixel voltage value is performed. At each sampling, the pixel value may be stored digitally outside of the pixel array.

In mode B1 operation, after the partial reset is performed, the reset level voltage $V_{RL}$ may be set to the power supply Vdd voltage or may remain at the partial reset voltage.

In Mode B1, the full well will be proportional to the sum of the PD and FD capacities at Vpr, as well as the Tg capacity at the transfer gate "on" bias voltage. The conversion gain will be inversely proportional to the sum of the PD, FD, and Tg capacitances.

Mode B2

In a fifth embodiment, a fifth CSM operating mode (Mode B2) is configured for multi-readout, with transfer gate signal Tg toggling high during read. Mode B2 is an extension of Mode A1 to multi-readout per frame.

Figure 12:
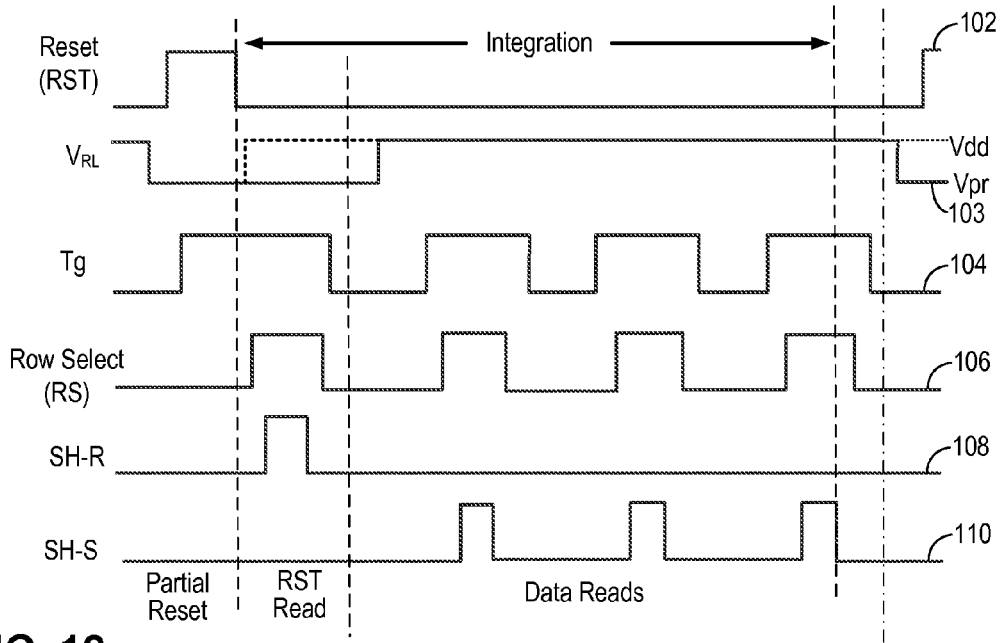
FIG. 12 is a timing diagram for CSM Operation Mode B2, utilizing multi-readout, with the transfer gate toggling and set to high during data read according to one embodiment of the present invention.

FIG. 12 is a timing diagram for CSM Operation Mode B2, utilizing multi-readout, with the transfer gate toggling and set to high during data read according to one embodiment of the present invention. Mode B2 operates in the same manner as mode A1 where a partial reset is carried out and light integration begins when the reset signal RST is deasserted. In Mode B2, the transfer gate Tg remains asserted after partial reset to allow the reset voltage value to be read out during the RST Read period.

After the reset read period and during the light integration period, the transfer gate signal Tg is periodically asserted to transfer charge from the photodiode to the floating diffusion. More specifically, each time the transfer gate signal Tg is asserted, the transfer gate signal has a pulse width long enough for charge transfer to reach steady state between the photodiode PD and the floating diffusion FD. In embodiments of the present invention, the transfer gate signal Tg pulse width is a function of the PD-FD settling time and the time required for read out after settling. During the time the transfer gate signal Tg is asserted, the row select signal RS and the control signal SH-S are asserted to read out the pixel value. The pixel value may be stored digitally outside of the pixel array. The transfer gate signal Tg is then deasserted until a given integration period expires. The charge transfer and read out process repeat throughout the light integration period to read out multiple samples of the light-dependent pixel value. At the end of the current frame, a partial reset is performed to start the next frame.

In mode B2 operation, after the partial reset is performed, the reset level voltage $V_{RL}$ may be set to the power supply Vdd voltage or may remain at the partial reset voltage.

Mode B2 will need to have the reset level read (RST read) prior to start of integration. The full well will be proportional to the sum of the PD and FD capacities at the partial reset voltage Vpr, while the conversion gain will be inversely proportional to the sum of PD, FD, and Tg capacitances.

Mode B3

In a sixth embodiment, a sixth CSM operating mode (Mode B3) is configured for multi-readout, with Tg toggling low during read. Mode B3 is an extension of Mode A3 to multi-readout per frame.

Figure 13:
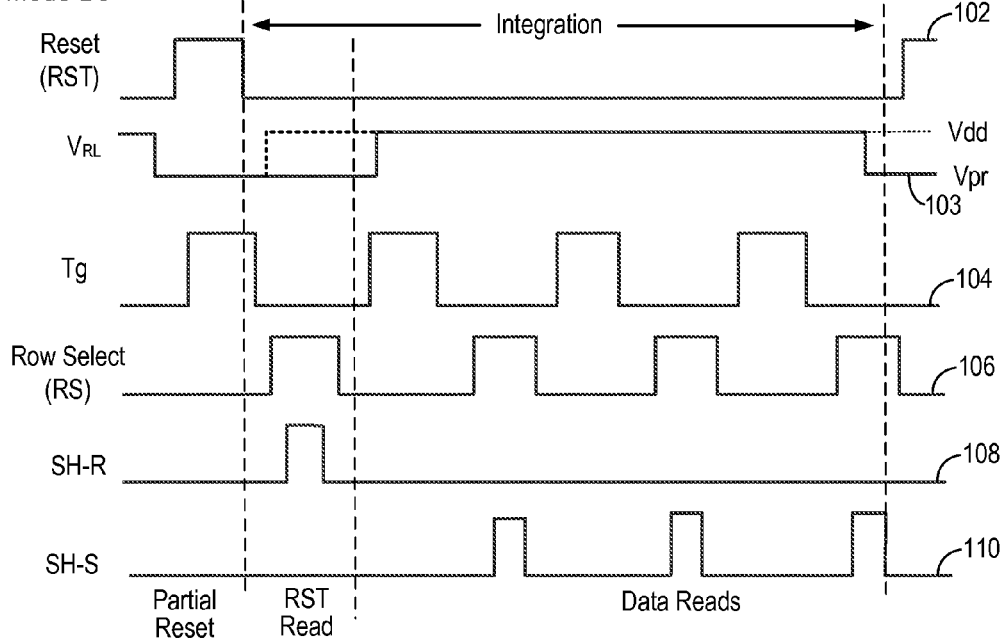
FIG. 13 is a timing diagram for CSM Operation Mode B3 utilizing multi-readout, with the transfer gate toggling and set low during data read according to one embodiment of the present invention.

FIG. 13 is a timing diagram for CSM Operation Mode B3 utilizing multi-readout, with the transfer gate toggling and set low during data read according to one embodiment of the present invention. Mode B3 operates in the same manner as mode A3 where a partial reset is carried out and light integration begins when the reset signal RST is deasserted. In Mode B2, the transfer gate Tg is deasserted after partial reset and during the reset read period. After the reset read period and during the light integration period, the transfer gate signal Tg is periodically asserted to transfer charge from the photodiode to the floating diffusion. However, the transfer gate signal Tg and the row select signal RS and the control signal SH-S are mutually exclusive. that is, the transfer gate signal Tg is asserted when the row select signal RS and the control signal SH-S are deasserted, and vice versa.

More specifically, after a first integration phase, the transfer gate signal Tg is asserted with a pulse width long enough for charge transfer to reach steady state between the photodiode PD and the floating diffusion FD. The transfer gate signal Tg is then set low, and the pixel data is read out and stored digitally by asserting the row select signal RS and the control signal SH-S. The next integration phase starts, after which the transfer gate signal Tg is again pulsed high long enough for the PD and FD charges to reach steady state. The transfer gate signal Tg is again set low, and the pixel data is read out and stored digitally. The charge transfer and read out process repeats throughout the light integration period until the last data read. Multiple samples of the light-dependent pixel value are thus obtained. At the end of the current frame, a partial reset is performed to start the next frame.

Mode B3 will need to have the reset level read (RST read) prior to start of integration. In Mode B3, the full well will be proportional to the PD capacity at the partial reset voltage Vpr, while the conversion gain will be inversely proportional to FD plus PD capacitances.

Alternate Embodiments

In another embodiment, in any of the above operation modes, the partial reset may be preceded by a full reset to the pinning voltage of the photodiode. The full reset may be performed to reduce noise.

According to another embodiment, regional timing control is used for an image sensor configured as a two-dimensional pixel array. In regional timing control, areas of the sensor that are receiving low light may be operated in the high conversion gain mode, while other areas of the sensor receiving bright light may be operated in the low conversion gain mode. The size of a region can vary from 1 pixel to most of the pixels of the array.

The above descriptions are illustrative only and are not intended to be limited. Other timing control may be used to operate the charge sharing mode within the scope of the present invention. Furthermore, the exact timing will depend on factors such as pixel architecture (4T, digital pixel, global shutter, etc). Other timing scheme may be used to realize the high CG and the low CG operation modes.

Summary

In summary, in embodiments of the present invention, an image sensor is configured to provide variable conversion gain without any additional pixel circuitry.

In one embodiment, the image sensor is configured to operate in a high conversion gain mode and a low conversion gain mode where the low conversion gain mode is realized through charge sharing between the floating diffusion and the photodiode of a pixel circuit.

In one embodiment, the selection between the high conversion gain operation mode and the low conversion gain operation mode is carried out by automatic control, such as by sensing the light level impinging on the image sensor. In another embodiment, the selection between the high CG and low CG operation modes is user selected.

In one embodiment, the image sensor is configured to select one of the two operation modes on a regional basis. That is, a first group of pixels in the image sensor may be operated at a first operation mode while a second group of pixels in the image sensor may be operated at a second operation mode.

According to another aspect of the present invention, a pixel of an image sensor is configured to operate in two or more operating modes. In a first operation mode, the photodiode of the pixel is fully reset to the photodiode pinning voltage. In a second operation mode, the photodiode and the floating diffusion are reset to substantially the same potential, with the reset potential being less then the photodiode pinning voltage, referred to as a partial reset.

In one embodiment, in the second operation mode, the photodiode of the pixel is fully reset before the partial reset.

In one embodiment, the reset potential is set by the voltage on the reset transistor. In one embodiment, a partial reset voltage is supplied to the drain terminal of the reset transistor and the reset potential in the second operation mode is set by the partial reset voltage.

The pixel circuit can be operated in a single read-out mode, multiple read-out mode, with the transfer gate signal held high or held low, as described above with reference to FIGS. 8-13.

In another embodiment, the gate voltage of the transfer gate signal is selected to trade off the effect of dark current, speed, and lag.

The above detailed descriptions are provided to illustrate specific embodiments of the present invention and are not intended to be limiting. Numerous modifications and variations within the scope of the present invention are possible. The present invention is defined by the appended claims.

We claim:

1. An image sensing device comprising:
an array of light sensing elements, respective ones of the light sensing elements comprising a photodiode and a plurality of control transistors, the plurality of control transistors comprising at least a transfer gate transistor, a reset transistor, and a source follower transistor, the transfer gate transistor having a drain terminal being a floating diffusion node and a source terminal coupled to the photodiode, the reset transistor having a drain terminal coupled to a reset level voltage and a source terminal coupled to the floating diffusion node, and the source follower transistor having a gate terminal coupled to the floating diffusion node and a drain terminal connected to a positive power supply voltage,
wherein respective ones of the light sensing elements are configured to generate an output pixel voltage indicative of an intensity level of light impinging on the photodiode, and the plurality of control transistors are configured to control reset, light integration, charge transfer and data read operations of respective ones of the light sensing elements; and
wherein respective ones of the light sensing elements are configured to selectively operate in a first operation mode for high conversion gain or a second operation mode for low conversion gain, the reset level voltage being the positive power supply voltage in the first operation mode and the reset level voltage being a partial reset voltage having a voltage value slightly less than a pinning voltage of the photodiode in the second operation mode; and the positive power supply voltage is the same in both the first and second operation modes.

2. The image sensing device of claim 1, wherein in the second operation mode, during the charge transfer operation with the transfer gate transistor turned on, charge collected at the photodiode from the impinging light equilibrates between the photodiode and the floating diffusion node.

3. The image sensing device of claim 1, wherein in the first operation mode, the photodiode is reset to the pinning voltage and the floating diffusion node is reset to the positive power supply voltage during the reset operation of the light sensing element.

4. The image sensing device of claim 1, wherein the reset level voltage coupled to the drain terminal of the reset transistor is switchably connected to the positive power supply voltage and the partial reset voltage, a mode select signal selecting one of the positive power supply voltage and the partial reset voltage for the reset level voltage.

5. The image sensing device of claim 4, wherein the mode select signal is a signal indicative of the light intensity level impinging on the array of light sensing elements.

6. The image sensing device of claim 4, wherein the mode select signal is generated from user input.

7. The image sensing device of claim 1, wherein a first group of the light sensing elements in the array is operated in the first operation mode while a second group of the light sensing elements in the array is operated in the second operation mode.

8. The image sensing device of claim 1, wherein the transfer gate transistor is controlled by a transfer gate signal and the reset transistor is controlled by a reset signal, the reset operation being carried out by asserting the transfer gate signal and the reset signal simultaneously; and wherein the plurality of control transistors further comprises a row select transistor configured to transfer charge on the floating diffusion node to a bitline, the row select transistor being controlled by a row select signal for reading out the output signal of the photodiode during the data read operation.

9. The image sensing device of claim 8, wherein in the second operation mode, the row select signal is asserted following the reset operation to read out a reset voltage of the floating diffusion node.

10. The image sensing device of claim 8, wherein in the second operation mode, the transfer gate signal is deasserted during at least a portion of the light integration operation, and the transfer gate signal and the row select signal are asserted at the end of the light integration operation and during the data read operation to read out the output pixel voltage.

11. The image sensing device of claim 8, wherein in the second operation mode, the transfer gate signal is asserted during the entire light integration operation, and the transfer gate signal and the row select signal are asserted during the data read operation to read out the output pixel voltage.

12. The image sensing device of claim 8, wherein in the second operation mode, the transfer gate signal is deasserted during at least a portion of the light integration operation; the transfer gate signal is asserted near the end of the light integration operation to transfer charge from the photodiode to the floating diffusion node; and the transfer gate is deasserted while the row select signal is asserted during the data read operation to read out the output pixel voltage.

13. The image sensing device of claim 8, wherein in the second operation mode, the transfer gate signal is asserted during the entire light integration period, and the row select signal is asserted periodically during the light integration operation to read out multiple samples of the output pixel voltage.

14. The image sensing device of claim 8, wherein in the second operation mode, the transfer gate signal is asserted periodically during the light integration period, the transfer gate signal being asserted with a pulse width long enough to allow the charge transfer between the photodiode and the floating diffusion node to reach steady state, and the row select signal is asserted when the transfer gate signal is asserted to read out multiple samples of the output pixel voltage.

15. The image sensing device of claim 8, wherein in the second operation mode, the transfer gate signal is asserted periodically during the light integration period, the transfer gate signal being asserted with a pulse width long enough to allow the charge transfer between the photodiode and the floating diffusion to read steady state, and the row select signal is asserted when the transfer signal is deasserted to read out multiple samples of the output pixel voltage.

16. A method in an image sensing device, comprising:
providing an array of light sensing elements, respective ones of the light sensing elements comprising a photodiode and a plurality of control transistors, the plurality of control transistors comprising at least a transfer gate transistor, a reset transistor, and a source follower transistor, the transfer gate transistor having a drain terminal being a floating diffusion node and a source terminal coupled to the photodiode, the reset transistor having a drain terminal coupled to a reset level voltage and a source terminal coupled to the floating diffusion node, and the source follower transistor having a gate terminal coupled to the floating diffusion node and a drain terminal connected to a positive power supply voltage, the plurality of control transistors being configured to control reset, light integration, charge transfer and data read operations of respective ones of the light sensing elements;

generating at respective ones of the light sensing elements an output pixel voltage indicative of an intensity level of light impinging on the photodiode;

operating one or more light sensing elements in a first operation mode for high conversion gain or a second operation mode for low conversion gain;

providing the positive power supply voltage for the reset level voltage to operate a light sensing element in the first operation mode; and providing a partial reset voltage having a voltage slightly less than a pinning voltage of the photodiode for the reset level voltage to operate a light sensing element in the second operation mode; wherein the positive power supply voltage is the same in both the first and second operation modes.

17. The method of claim 16, further comprising:
integrating charge at the photodiode as a function of the impinging light;
in the second operation mode, turning on the transfer gate transistor of a light sensing element during the charge transfer operation, such that charge collected at the photodiode from the impinging light equilibrates between the photodiode and the floating diffusion node.

18. The method of claim 16, further comprising:
resetting one or more light sensing elements in the first operation mode, the photodiode being reset to the pinning voltage and the floating diffusion node being reset to the positive power supply voltage.

19. The method of claim 16, further comprising:
selecting between the first operation mode and the second operation mode based on a mode select signal, the mode select signal being a signal indicative of the light intensity level impinging on the array of light sensing elements or a signal generated from user input.

20. The method of claim 16, wherein operating one or more light sensing elements in a first operation mode for high conversion gain or a second operation mode for low conversion gain comprises operating a first group of the light sensing elements in the array in the first operation mode and operating a second group of the light sensing elements in the array in the second operation mode.

* * * * *